United States Patent
Furuhashi et al.

(10) Patent No.: US 10,593,542 B2
(45) Date of Patent: Mar. 17, 2020

(54) MANUFACTURING METHOD OF A SEMICONDUCTOR DEVICE

(71) Applicant: TOSHIBA MEMORY CORPORATION, Minato-ku (JP)

(72) Inventors: Takashi Furuhashi, Kuwana (JP); Masayuki Tanaka, Yokkaichi (JP); Shinji Mori, Yokkaichi (JP); Kenichiro Toratani, Kuwana (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/695,203

(22) Filed: Sep. 5, 2017

(65) Prior Publication Data
US 2018/0261445 A1     Sep. 13, 2018

(30) Foreign Application Priority Data
Mar. 8, 2017  (JP) .................................. 2017-044258

(51) Int. Cl.
H01L 21/02     (2006.01)
H01L 21/67     (2006.01)
H01L 21/28     (2006.01)
H01L 27/11582  (2017.01)

(52) U.S. Cl.
CPC ........ H01L 21/022 (2013.01); H01L 21/0228 (2013.01); H01L 21/02172 (2013.01); H01L 21/02178 (2013.01); H01L 21/28 (2013.01); H01L 21/67098 (2013.01); H01L 21/67207 (2013.01); H01L 27/11582 (2013.01); H01L 29/40117 (2019.08)

(58) Field of Classification Search
CPC ............ H01L 21/022; H01L 27/11582; H01L 21/28282; H01L 21/02178; H01L 21/0228; H01L 21/28; H01L 21/67207; H01L 21/02172; H01L 21/67098
See application file for complete search history.

(56) References Cited

U.S. PATENT DOCUMENTS 6,323,115 B1   11/2001   Tanabe et al.
7,767,594 B2    8/2010   Miya et al.
7,972,927 B2    7/2011   Fujitsuka et al.
(Continued)

FOREIGN PATENT DOCUMENTS

JP      11-330468      11/1999
JP      2010-045239     2/2010
(Continued)

*Primary Examiner* — Su C Kim
(74) *Attorney, Agent, or Firm* — Oblon, McClelland, Maier & Neustadt, L.L.P.

(57) ABSTRACT

According to an embodiment, a manufacturing method of a semiconductor device includes: carrying a substrate alternately stacked an electrode layer and an insulation layer into a chamber; increasing the temperature in the chamber to a predetermined temperature; and supplying hydrogen and material gas including metal simultaneously into the chamber, and supplying oxidizing gas the partial pressure ratio of which to the hydrogen is set so as to provide an atmosphere of reducing the electrode layer, by using an ALD method, and thereby forming, on a surface of the electrode layer and a surface of the insulation layer, a metal oxide layer obtained by oxidizing the metal.

12 Claims, 4 Drawing Sheets

(56) References Cited

U.S. PATENT DOCUMENTS

| | | | |
|---|---|---|---|
| 8,008,152 B2 | 8/2011 | Fujitsuka et al. | |
| 8,426,302 B2 | 4/2013 | Matsushita et al. | |
| 2002/0182820 A1* | 12/2002 | Choi | H01L 21/02178 |
| | | | 438/396 |
| 2006/0273320 A1* | 12/2006 | Natori | C23C 16/40 |
| | | | 257/66 |
| 2009/0246367 A1* | 10/2009 | Huotari | B82Y 30/00 |
| | | | 427/215 |
| 2012/0174960 A1* | 7/2012 | Hashigami | H01L 31/02167 |
| | | | 136/244 |
| 2014/0054670 A1* | 2/2014 | Lee | H01L 21/764 |
| | | | 257/319 |
| 2017/0125436 A1* | 5/2017 | Sharangpani | H01L 27/11582 |

FOREIGN PATENT DOCUMENTS

| | | |
|---|---|---|
| JP | 2011-176330 | 9/2011 |
| JP | 4921837 | 4/2012 |
| JP | 5518880 | 6/2014 |

* cited by examiner

MANUFACTURING METHOD OF A SEMICONDUCTOR DEVICE

CROSS-REFERENCE TO RELATED APPLICATIONS

This application is based upon and claims the benefit of priority from Japanese Patent Application No. 2017-044258, filed on Mar. 8, 2017; the entire contents of which are incorporated herein by reference.

FIELD

An embodiment according to the present invention relates to a manufacturing method of a semiconductor device.

BACKGROUND

Manufacturing process of a semiconductor device include a process for forming a metal oxide layer on a surface of an electrode layer and on a surface of an insulation layer by supplying material gas including metal and oxidizing gas into a chamber in a high temperature state.

In the process, oxygen released from the insulation layer and the oxidizing gas may oxidize metal included in the electrode layer. Oxidization of the metal may cause a malfunction such as an increase in electrical resistance.

A problem to be solved by the present invention is to provide a manufacturing method of a semiconductor device in which oxidation of an electrode layer can be inhibited.

DETAILED DESCRIPTION

Embodiments will now be explained with reference to the accompanying drawings. The present invention is not limited to the embodiments.

Figure 1:
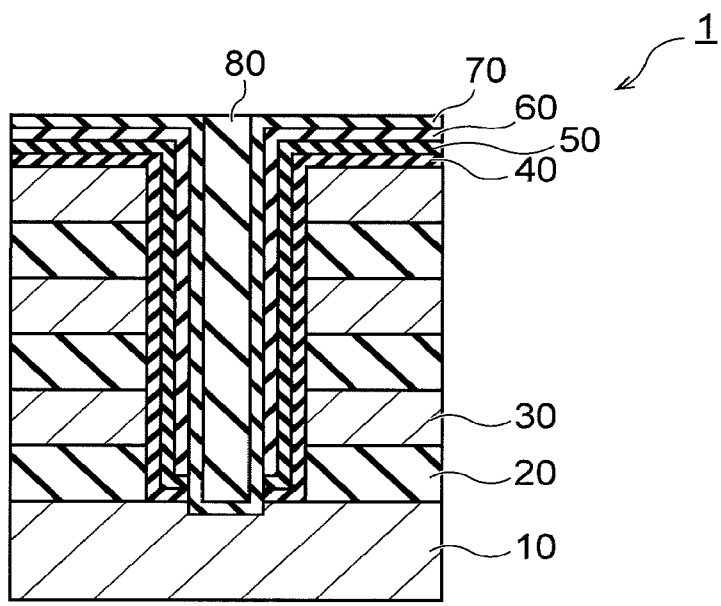
FIG. 1 is a cross sectional view of a semiconductor device according to a first embodiment.

FIG. 1 is a cross sectional view of a semiconductor device according to the present embodiment. A semiconductor device 1 according to the present embodiment includes a substrate 10, an insulation layer 20, an electrode layer 30, a charge block layer 40, a charge trap layer 50, a tunnel insulation layer 60, a channel layer 70, and a core layer 80. The semiconductor device 1 is a so-called 3D type semiconductor storage device. Hereinafter, a manufacturing method for the semiconductor device 1 is described with reference to FIGS. 2 to 7.

Figure 2:
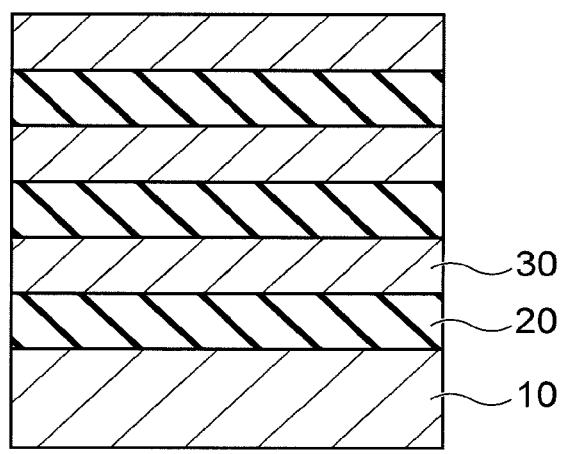
FIG. 2 is a cross sectional view of a process for forming an insulation layer and an electrode layer.

First, as shown in FIG. 2, the insulation layers 20 and the electrode layers 30 are alternately stacked on the substrate 10. The substrate 10 is a single crystal silicon substrate, for example. The insulation layer 20 includes silicon oxide formed by a CVD (Chemical Vapor Deposition) method or an ALD (Atomic Layer Deposition) method, for example. The electrode layer 30 includes metal or metal silicide formed by a sputtering method or a CVD method, for example. Specifically, the electrode layer 30 includes any of tungsten, molybdenum, aluminum, cobalt, copper, gold, or nickel silicide.

Figure 3:
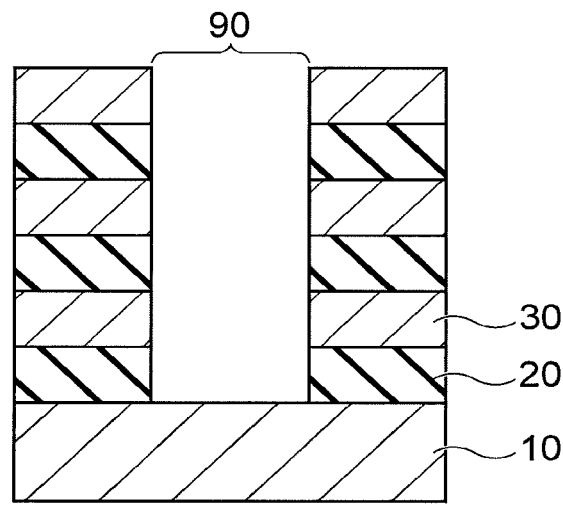
FIG. 3 is a cross sectional view of a process for forming a memory hole.

Next, as shown in FIG. 3, a memory hole 90 is formed by an RIE (Reactive Ion Etching) method, for example. The memory hole 90 extends through the insulation layers 20 and the electrode layers 30 and reaches the substrate 10. In the present embodiment, a plurality of the memory holes 90 are formed in a matrix shape.

Figure 4:
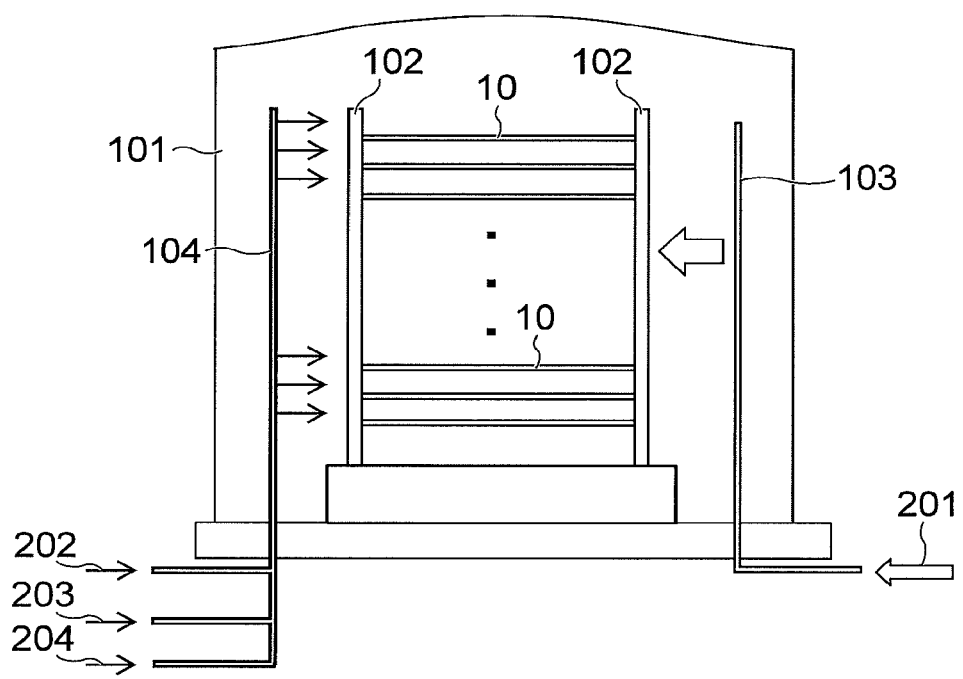
FIG. 4 is a schematic diagram illustrating a process for forming a charge block layer.
Figure 5:
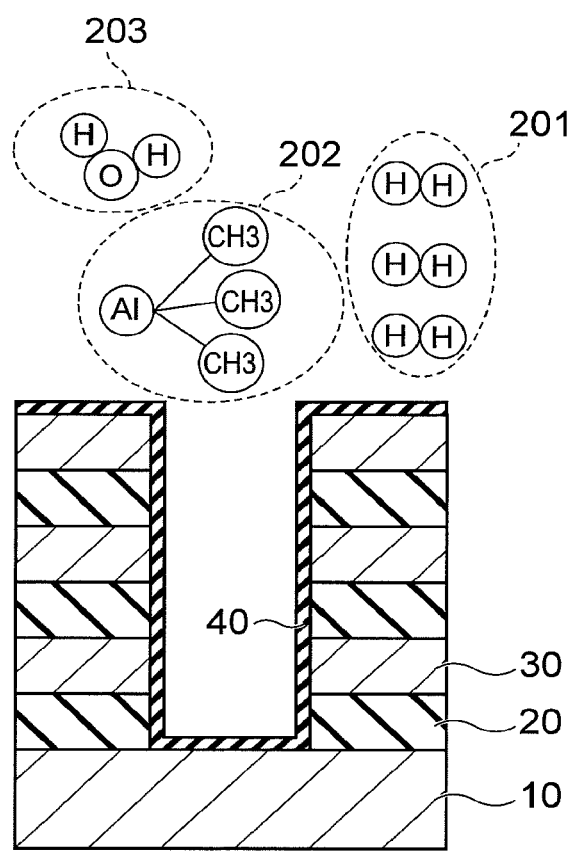
FIG. 5 is a cross sectional view of the process for forming the charge block layer.

Next, as shown in FIG. 4, the charge block layer 40 is formed by an ALD method or a CVD method, for example. A method of forming the charge block layer 40 by using an ALD method is described below in detail with reference to FIGS. 4 and 5.

As shown in FIG. 4, first, the substrates 10 with the memory holes 90 are carried into a chamber 101. Here, a plurality of the substrates 10 are carried into the chamber 101 so as to be supported, at an interval, by a support member 102.

Next, the chamber 101 is vacuumized and the temperature in the chamber 101 is increased. When the temperature starts to increase, supply of hydrogen 201 from piping 103 into the chamber 101 is started. When the temperature in the chamber 101 reaches a predetermined temperature, material gas 202 is supplied into the chamber 101 from piping 104 which is separated from the piping 103. Accordingly, a part of the material gas 202 adheres onto surfaces of the insulation layers 20 and surfaces of the electrode layers 30 including the internal surface of the memory hole 90. During this supply, supply of the hydrogen 201 is continued.

Next, inert gas 204 is supplied from the piping 104 into the chamber 101. Accordingly, the material gas 202 floating in the chamber 101 is discharged through a discharge port (not shown) which is provided in the chamber 101. As the inert gas 204, nitrogen gas, argon gas, or the like can be used.

Next, oxidizing gas 203 is supplied from the piping 104 into the chamber 101. Accordingly, metal included in the material gas 202 is oxidized. As a result, a metal oxide layer, that is, the charge block layer 40 is formed on surfaces of the insulation layers 20 and surfaces of the electrode layers 30. Next, the inert gas 204 is again supplied into the chamber 101, and thus, the oxidizing gas 203 floating in the chamber 101 is discharged through the discharge port. At this time, the thickness of the charge block layer 40 has not reached a predetermined value. Therefore, until the thickness of the charge block layer 40 reaches the predetermined value, supply and discharge of the material gas 202, the oxidizing gas 203, and the inert gas 204 are repeated.

When supply and discharge of the gasses are completed, the temperature in the chamber 101 is decreased. Subsequently, the plurality of substrates 10 and the support member 102 are carried out from the chamber 101. During the carrying, supply of the hydrogen 201 is stopped.

In the present embodiment, the temperature in the chamber 101 and the partial pressure ratio of the oxidizing gas 203 to the hydrogen 201 are set such that, during supply of the oxidizing gas 203, the metal included in the electrode layers 30 is reduced while the metal included in the material gas 202 is oxidized. For example, the metal included in the electrode layers 30 is assumed to be tungsten, the metal included in the material gas 202 is assumed to be TMA (trimethylaluminium), and the oxidizing gas 203 is assumed to be water vapor (H₂O).

Figure 6:
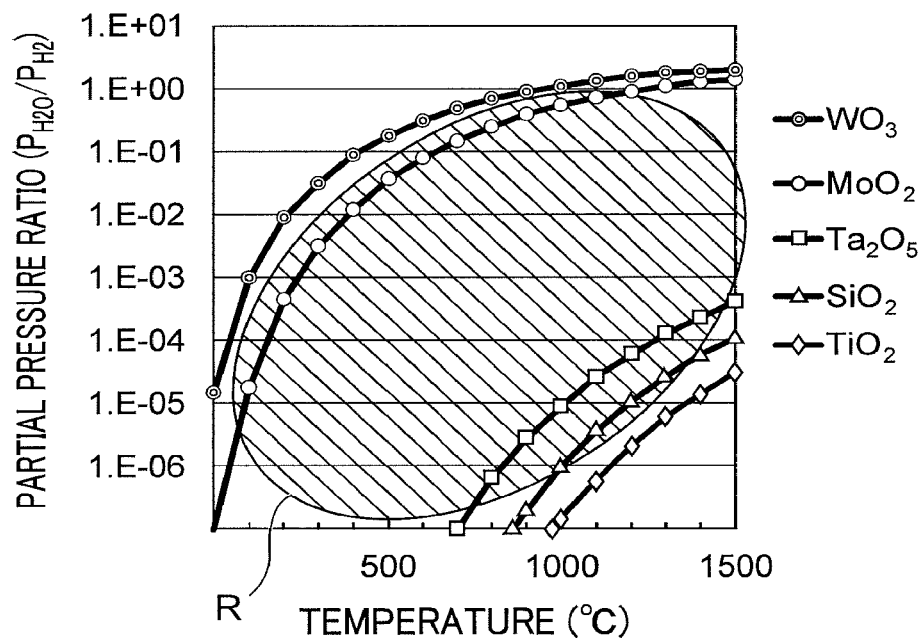
FIG. 6 shows an example of an Ellingham diagram showing a relationship between temperature and a partial pressure ratio of water to hydrogen.

FIG. 6 shows an example of an Ellingham diagram showing a relationship between temperature and a partial pressure ratio of water to hydrogen. FIG. 6 shows the Ellingham diagram of tungsten, molybdenum, tantalum, silicon, and titanium. According to the Ellingham diagram shown in FIG. 6, a region R exists in which the oxidizing gas 203 acts, as oxidizing gas, on aluminum while the oxidizing gas 203 acts, as reducing gas, on tungsten. When the temperature in the chamber 101 is set to 300° C. and the partial pressure ratio of the oxidizing gas 203 to the hydrogen 201 is set to 1:33 or greater, for example, the aluminum is oxidized and the tungsten is reduced. Accordingly, the charge block layer 40 composed of aluminum oxide can be formed while any tungsten oxide is not formed on the electrode layers 30.

In addition, by controlling the temperature in the chamber 101 and the partial pressure ratio of the oxidizing gas 203 to the hydrogen 201, molybdenum, aluminum, cobalt, copper, gold, nickel silicide, or the like may be used, instead of tungsten, for the electrode layers 30. A pure material of zirconium oxide, hafnium oxide, aluminum oxide, lanthanum oxide, yttrium oxide, titanium oxide, tantalum oxide, or silicon oxide, or a mixture thereof with another material may be used, instead of the aluminum oxide, for the charge block layer 40. Further, ozone, oxygen, oxygen radicals, oxygen nitride, or the like may be used, instead of the water vapor, for the oxidizing gas 203.

Figure 7:
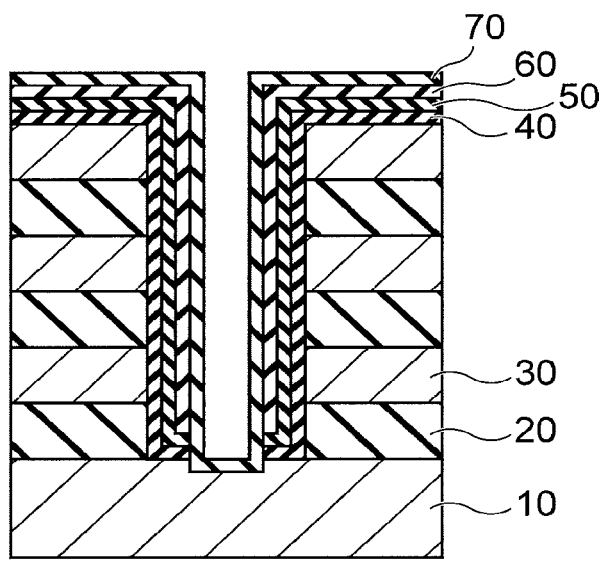
FIG. 7 is a cross sectional view of a process for forming a charge trap layer, a tunnel insulation layer, and a channel layer.

After the charge block layer 40 is formed as described above, the charge trap layer 50, the tunnel insulation layer 60, and the channel layer 70 are sequentially formed as shown in FIG. 7. The charge trap layer 50 is formed on the charge block layer 40 by an ALD method or a CVD method, for example. The charge trap layer 50 includes silicon nitride, for example.

The tunnel insulation layer 60 is formed on the charge trap layer 50 by an ALD method or a CVD method, for example. The tunnel insulation layer 60 includes silicon oxide, for example.

The channel layer 70 is formed on the tunnel insulation layer 60 by a CVD method, for example. The channel layer 70 includes amorphous silicon, for example. When the channel layer 70 is formed, portions of the channel layer 70, the tunnel insulation layer 60, the charge trap layer 50, and the charge block layer 40 that are formed on the bottom of the memory hole 90, are removed by an RIE method, etc., and further, an upper layer portion of the substrate 10 is also removed. Then, the channel layer 70 is formed again to be crystallized by annealing.

Then, referring back to FIG. 1, the core layer 80 is formed on the channel layer 70 by an ALD method or a CVD method, for example. The core layer 80 includes silicon oxide, for example. Subsequently, for example, a wiring layer, etc. is formed, and thus, the semiconductor device 1 is completed.

According to the present embodiment described above, when the material gas 202 is supplied into the chamber 101 with high temperature, the hydrogen 201 is simultaneously being supplied into the chamber 101. As a result, an amount of oxygen released from the insulation layers 20 is limited. Therefore, oxidization of the electrode layers 30 due to the temperature can be inhibited. If the electrode layers 30 are oxidized and sublimated, sublimated metal oxide might be taken into the insulation layers 20 so as to cause leakage between the electrodes. Alternately, if the metal oxide is taken into the charge block layer 40, leak current in a memory cell might be increased.

The partial pressure ratio of the oxidizing gas 203 to the hydrogen 201 and the temperature in the chamber 101 are set such that, during supply of the oxidizing gas 203, the metal included in the electrode layers 30 is reduced while the metal included in the material gas 202 is oxidized. As a result, oxidization of the electrode layers 30 due to the oxidizing gas 203 also can be inhibited.

In particular, in the present embodiment, supply of the hydrogen 201 is continued after the temperature in the chamber 101 starts to increase until the substrate 10 is carried out from the chamber 101. Accordingly, when the charge block layer 40 is formed, the hydrogen 201 constantly exists in the chamber 101. As a result, oxidization of the electrode layers 30 can be more assuredly prevented.

Further, in the present embodiment, the temperature in the chamber 101 is set within such a range as to allow formation of the charge block layer 40 by an ALD method. Accordingly, the charge block layer 40 can be formed even in the memory hole 90 with a high aspect ratio.

In the present embodiment, the substrate 10 may be carried into the chamber 101 after an inert state in the chamber 101 is achieved in advance by supply of the inert gas 204. In this case, oxidization of the electrode layers 30 can be prevented during a time period after the substrate 10 is carried in until supply of the hydrogen 201 is started.

Moreover, prior to supply of the material gas 202, that is, prior to formation of the charge block layer 40, the electrode layers 30 may be annealed with the hydrogen 201 being supplied. Specifically, the temperature in the chamber 101 is temporarily increased to a temperature higher than the film formation temperature. In this case, even when metal oxide is formed in the electrode layers 30 during carrying of the substrate 10 in the atmosphere, the metal oxide can be reduced to metal by the annealing.

After the charge block layer 40 is formed, the electrode layers 30 may be annealed with the hydrogen 201 being supplied. As a result of this annealing, the hydrogen 201 passes through the charge block layer 40 and enters into the electrode layers 30. Therefore, even when the charge block layer 40 is formed in a state where a portion of the electrode layers 30 has been oxidized, the electrode layers 30 are reduced, whereby oxidation of the electrode layer 30 can be prevented.

In the present embodiment, the manufacturing method for a 3D type semiconductor storage device has been described. However, the manufacturing method can be adopted as a manufacturing method of a semiconductor device including a process for forming a metal oxide layer on a surface of an electrode layer and a surface of an insulation layer.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A manufacturing method of a semiconductor device comprising:

introducing a substrate into a chamber, an insulating layer and an electrode layer being formed on the substrate;

increasing a temperature in the chamber to a predetermined temperature;

simultaneously supplying hydrogen and material gas including metal into the chamber; and forming a metal oxide layer on a surface of the electrode layer and on a surface of the insulating layer by supplying oxidizing gas into the chamber, wherein the oxidizing gas and the hydrogen gas are simultaneously supplied from respective sources into the chamber under a predetermined partial pressure ratio to oxidize the metal of the material gas and to reduce a metal of the electrode layer.

2. The manufacturing method of the semiconductor device according to claim 1, wherein supply of the hydrogen into the chamber is continued after the temperature in the chamber starts to increase until the substrate on which the metal oxide layer has been formed is carried out from the chamber.

3. The manufacturing method of the semiconductor device according to claim 1, wherein the substrate is carried into the chamber after an inert state in the chamber is achieved.

4. The manufacturing method of the semiconductor device according to claim 1, wherein before or after the metal oxide layer is formed, the electrode layer is annealed with the hydrogen being supplied into the chamber.

5. The manufacturing method of the semiconductor device according to claim 1, wherein the electrode layer includes tungsten, molybdenum, aluminum, cobalt, copper, gold, or nickel silicide, and the metal included in the material gas includes a pure material of aluminum, zirconium, hafnium, lanthanum, yttrium, titanium, tantalum, or silicon, or a mixture thereof with another material.

6. The manufacturing method of the semiconductor device according to claim 1, wherein the metal oxide layer is a charge block layer.

7. The manufacturing method of the semiconductor device according to claim 6, wherein a hole extending through the electrode layer and the insulation layer is formed, and the charge block layer, a charge trap layer, a tunnel insulation layer, and a channel layer are sequentially formed in the hole.

8. The manufacturing method of the semiconductor device according to claim 1, wherein when the metal oxide layer is formed, the material gas is discharged from the chamber by using inert gas, and then, the oxidizing gas is supplied into the chamber.

9. The manufacturing method of the semiconductor device according to claim 1, wherein piping from which the material gas is supplied into the chamber is separated from piping from which the hydrogen is supplied into the chamber.

10. The manufacturing method of the semiconductor device according to claim 5, wherein the electrode layer is formed from tungsten, aluminum is used as the metal included in the material gas, water vapor is used as the oxidizing gas, and the predetermined temperature is set to 300° C. and the partial pressure ratio is set to 1:33 or greater.

11. The manufacturing method of the semiconductor device according to claim 1, wherein before and after the metal oxide layer is formed, the electrode layer is annealed with the hydrogen being supplied into the chamber.

12. The manufacturing method of the semiconductor device according to claim 1, wherein the oxidizing gas and the hydrogen are separately supplied into the chamber from different pipes.

* * * * *